US012626835B2

(12) United States Patent
Chen et al.

(10) Patent No.: US 12,626,835 B2
(45) Date of Patent: May 12, 2026

(54) CONDUCTIVE SILVER ALUMINUM PASTE, METHOD FOR PREPARING THE SAME, AND ELECTRODE USING THE SAME

(71) Applicant: Shanghai Silver Paste Sci. & Tech. Co., LTD., Shanghai City (CN)

(72) Inventors: Xiaolong Chen, Shanghai City (CN); Jie Liu, Shanghai City (CN); Can Ma, Shanghai City (CN); Li Zhang, Shanghai City (CN); Hongxia Ran, Shanghai City (CN); Bing Liu, Shanghai City (CN); Tian Yue, Shanghai City (CN); Xiang Wang, Shanghai City (CN)

(73) Assignee: SHANGHAI SILVER PASTE SCI. & TECH. CO., LTD., Shanghai City (CN)

( * ) Notice: Subject to any disclaimer, the term of this patent is extended or adjusted under 35 U.S.C. 154(b) by 95 days.

(21) Appl. No.: 18/217,527

(22) Filed: Jun. 30, 2023

(65) Prior Publication Data

US 2024/0321476 A1      Sep. 26, 2024

(30) Foreign Application Priority Data

Mar. 20, 2023    (CN) .......................... 202310270595.1

(51) Int. Cl.
| | |
|---|---|
| *H01B 1/22* | (2006.01) |
| *B22F 1/054* | (2022.01) |
| *B22F 1/065* | (2022.01) |
| *B22F 1/103* | (2022.01) |
| *B22F 1/12* | (2022.01) |
| *B22F 3/10* | (2006.01) |
| *H10F 77/20* | (2025.01) |

(52) U.S. Cl.
CPC ............... *H01B 1/22* (2013.01); *B22F 1/056* (2022.01); *B22F 1/065* (2022.01); *B22F 1/103* (2022.01); *B22F 1/12* (2022.01); *B22F 3/10* (2013.01); *H10F 77/211* (2025.01); *B22F 2301/052* (2013.01); *B22F 2301/255*

(2013.01); *B22F 2302/05* (2013.01); *B22F 2302/25* (2013.01); *B22F 2302/35* (2013.01); *B22F 2302/45* (2013.01); *B22F 2304/056* (2013.01); *B22F 2304/058* (2013.01); *B22F 2304/10* (2013.01)

(58) Field of Classification Search
CPC ....................................................... H01B 1/22
See application file for complete search history.

(56) References Cited

U.S. PATENT DOCUMENTS

| | | | | |
|---|---|---|---|---|
| 11,756,699 | B1 * | 9/2023 | Chen ......................... | C03C 8/04 252/500 |
| 2013/0161572 | A1 * | 6/2013 | Ittel .......................... | H01B 1/22 252/514 |
| 2023/0183126 | A1 * | 6/2023 | Mao ...................... | C03C 14/004 |

* cited by examiner

*Primary Examiner* — William D Young

(74) *Attorney, Agent, or Firm* — Cheng-Ju Chiang

(57)      ABSTRACT

The present invention discloses a conductive silver aluminum paste, a preparation method, an electrode, and an N-type Topcon battery. The conductive silver aluminum paste comprises silver powder, metal powder containing aluminum element, powder containing silicon or boron element, glass powder, and organic carrier; wherein, when defining the total weight of the conductive silver aluminum paste as 100%, the weight percentage content of each component is: silver powder 80.0%-90.0%, metal powder containing aluminum element 0.5%-3.0%; powder containing silicon or boron element 0.1%-1.0%; glass powder 1.5%-6.0%; organic carrier 7.0%-15.0%. The present invention meets requirements for electrode materials of current development of N-type Topcon batteries well, and has advantages of low contact resistances, high open circuit voltages, high photoelectric conversion efficiency, and high output power.

1 Claim, No Drawings

CONDUCTIVE SILVER ALUMINUM PASTE, METHOD FOR PREPARING THE SAME, AND ELECTRODE USING THE SAME

CROSS REFERENCE TO RELATED APPLICATIONS

The present disclosure claims priority of Chinese patent application No. 202310270595.1 filed on Mar. 20, 2023. The entire contents of the above-identified applications are incorporated herein by reference.

TECHNICAL FIELD

The present invention belongs to the field of silicon solar cells, and in particular, relates to a conductive silver aluminum paste, a preparation method, an electrode, and an N-type Topcon battery.

BACKGROUND

With increasing shortage of fossil energy and increasing prominent of environmental pollution, problems caused by climate warming are more and more prominent. Sustainable development of new pollution-free energy projects has been widely and deeply studied in various countries. Solar cells are effective tools for converting light energy into electric energy by using photovoltaic effect, so they have also been developed rapidly in recent years, and photoelectric conversion efficiency of solar cells has also been greatly improved.

With advancement of technology, the mainstream of solar cells in the market has gradually shifted from polycrystalline silicon cells and Perc single crystal cells to Se-perc single crystal cells and N-type Topcon cells at present. Among them, since Se-perc single crystal batteries have developed earlier than N-type Topcon batteries, their current technology is more mature. However, their drawbacks are also more obvious than that of N-type Topcon batteries. With gradual maturity of technology, improvement of photoelectric conversion efficiency of Se-perc single crystal batteries gradually becomes narrow. Affected by material intrinsic characteristics of short lifetime of P-type silicon minority carriers and large photo induced attenuation, further improvement of photoelectric conversion efficiency of Se-perc single crystal batteries is severely restricted.

In order to pursue further improvement of photoelectric conversion efficiency of batteries, N-type Topcon batteries with a higher theoretical limit of photoelectric conversion efficiency have been widely studied and have achieved phased success. As a result, in recent years, there has been a transitional stage in which Se perc single crystal batteries gradually develop towards N-type Topcon batteries with higher efficiency, and various large battery production companies have quickly established their own N-type Topcon battery production lines. Therefore, new N-type Topcon batteries will eventually replace current mainstream P-type Se perc single crystal batteries and become a new mainstream of batteries. However, due to short and rapid development time of N-type Topcon batteries, technology development of electrode materials (conductive silver aluminum paste) that match them has not been fully mature, resulting in a significant impact on output power of N-type Topcon batteries. Therefore, developing a kind of conductive silver aluminum paste with high photoelectric conversion efficiency and high output power has important application value and economic value.

SUMMARY OF THE DISCLOSURE

The purpose of the present invention is to provide a conductive silver aluminum paste, a preparation method, an electrode, and an N-type Topcon battery; wherein, glass powder with good corrosion effect and wide sintering window is introduced and can adapt to sintering processes of wider N-type Topcon batteries; metal powder containing aluminum element with specific particle sizes and an appropriate amount is introduced and promotes formation of P++ junctions during sintering of silver aluminum paste, thereby increasing diffusion ability of minority carriers and increasing an open circuit voltage; by introducing an appropriate amount of antioxidants containing silicon or boron element powder, oxidation of silver powder and aluminum powder is reduced, and a sintering window difference between metal powder containing aluminum element and silver powder is balanced, further improvement of open circuit voltages of N-type Topcon batteries is realized, thereby achieving N-type Topcon monocrystalline silicon battery electrodes and electronic devices with low contact resistances, high open circuit voltages, high photoelectric conversion efficiency, and high output power. In order to achieve the above purposes, the present invention adopts technical solutions as follows.

The present invention provides a conductive silver aluminum paste comprising silver powder, metal powder containing aluminum element, powder containing silicon or boron element, glass powder, and organic carrier; wherein, when defining the total weight of the conductive silver aluminum paste as 100%, the weight percentage contents of the components are: silver powder 80.0%-90.0%, metal powder containing aluminum element 0.5%-30.0%; powder containing silicon or boron element 0.1%-1.0%; glass powder 1.5%-6.0%; organic carrier 7.0%-15.0%.

Furthermore, the silver powder is spherical and has a particle size of 0.2 μm~4.5 μm and a D50 of 0.6 μm~2.5 μm.

Furthermore, the metal powder containing aluminum element is spherical and has a particle size of 0.1 μm~6.0 μm and a D50 of 0.6 μm~2.0 μm.

Furthermore, the metal powder containing aluminum element is one or more of aluminum powder and alloy powder containing aluminum element, and the alloy powder containing aluminum element comprises at least one of aluminum silicon alloy, aluminum boron alloy, aluminum gallium alloy, aluminum lead alloy, and aluminum iron alloy powder.

Furthermore, the powder containing silicon or boron element has a particle size of 0.5 μm~8.0 μm and a D50 of 0.8 μm~3.0 μm.

Furthermore, the powder containing silicon or boron element is one or more of silicon powder, boron powder, compound powder containing silicon or boron element, and alloy powder containing silicon or boron element; the compound powder containing silicon or boron element comprises at least one of silicon nitride, silicon carbide, boron nitride, tungsten boride, tungsten silicide, and silicon boride powder, and the alloy powder containing silicon or boron element comprises at least one of silicon magnesium alloy and boron lead alloy powder.

Furthermore, the glass powder comprises one or more kind of main glass powder, or comprises one or more kind of main glass powder and one or more kind of auxiliary glass powder; wherein the main glass powder is in a Pb—B—Ge—O—Li system or a Pb—B—Si—O—Li system, or is Pb—B—Ge—Si—O—Li glass powder in a composite structure of the two; the auxiliary glass powder is in a Zn—Si—B—O—Li system or in a Ba—Si—B—O—Li system, or is Zn—Ba—Si—B—O—Li glass powder in a composite structure of the two; when defining the total weight of the glass powder as 100%, the weight percentage contents of the main glass powder and the auxiliary glass powder are: main glass powder 50%-100.0%; auxiliary glass powder 0.0%~50.0%.

Furthermore, in the main glass powder, when defining the total number of moles of the components contained in the main glass powder as 100%, the mole percentages of the components are: PbO 20.0%~60.0%; $B_2O_3$ 2.0%~40.0%; the sum of $GeO_2$ and $SiO_2$ 2.0%~40.0%; $Li_2O$ 2.0%~20.0%; modified additive 0.0%~35.0%.

Furthermore, in the auxiliary glass powder, when defining the total number of moles of the components contained in the auxiliary glass powder as 100%, the mole percentages of the components are: the sum of ZnO and BaO 20.0%~50.0%; $SiO_2$ 0.0%~40.0%; $B_2O_3$ 5.0%~50.0%; $Li_2O$ 10.0%~30.0%; auxiliary additive 0.0%~20.0%.

Furthermore, the modified additive is an oxide containing one or more element of Ca, Sr, Ba, Zn, Na, K, Cu, Tl, Ag, Al, Bi, W, Ga, Pr, Se, and Fe, or a composite that decomposes to obtain the oxide of the element during a process of manufacturing the main glass powder.

Furthermore, the auxiliary additive is an oxide containing one or more element of Ca, Sr, Pb, Na, K, Tl, Ag, Al, Bi, and Ge, or a composite that decomposes to obtain the oxide of the element during a process of manufacturing the auxiliary glass powder.

Furthermore, the organic carrier comprises organic solvent, organic resin, defoamer, leveling agent, and inorganic additive; when defining the total weight of the organic carrier as 100%, the weight percentage contents of the components are: organic solvent 30.0%~80.0%; organic resin 10.0%~40.0%; defoamer 2.0%~10.0%; leveling agent 2.0%~10.0%; inorganic additive 0.1%~5.0%.

Furthermore, the inorganic additive is one or more of magnesium lithium silicate, sodium magnesium silicate, and sodium magnesium lithium silicate.

A method for preparing the above conductive silver aluminum paste comprises the following steps.

Preparing glass powder: weighing raw materials used in glass powder according to a preset ratio; mixing them; after melting them at a high temperature, cooling them down, and drying them, through a crushing process, obtaining required glass powder.

Preparing organic carrier: weighing raw materials used in organic carrier according to a preset ratio; heating, stirring, and mixing them; dispersing them uniformly through high-speed centrifugation, and then filtering them to obtain organic carrier.

Preparing conductive silver aluminum paste: adding silver powder, metal powder containing aluminum element, powder containing silicon or boron element, and prepared glass powder into prepared organic carrier respectively according to a mass ratio, mixing them and stirring them uniformly, and then grinding them, adjusting their viscosity, and filtering them to obtain conductive silver aluminum paste.

The present invention further provides an electrode, the electrode is formed by sintering the above conductive silver aluminum paste on a surface of a battery silicon wafer.

The present invention further provides an N-type Topcon battery comprising the above electrode.

The conductive silver aluminum paste of the present invention introduces glass powder with good corrosion effect and a wide sintering window, which can adapt to sintering processes of wider N-type Topcon batteries. Since the difference in melting points between silver powder and aluminum powder is significant, and a melting point of introduced powder containing silicon or boron element is much higher than melting points of silver powder and aluminum powder, on one hand, the problem of large differences in local sintering of grid line, which is caused by the large difference in melting points between silver powder and aluminum powder, is balanced, and the problem of low opening pressures caused by local overburning of silver aluminum pastes is prevented; on the other hand, the melting point of the powder containing silicon or boron element is also much higher than that of the main glass powder, at higher temperatures, glass liquid formed after the main glass powder melts, after coming into contact with the powder containing silicon or boron element, will cause the powder containing silicon or boron element to be partially oxidized into silicon dioxide or boron trioxide and enter the glass liquid. In this way, high-temperature viscosity of the glass liquid can be increased, acting time of the glass liquid on silver powder and aluminum powder is prolonged, a corrosion depth of the main glass powder on the battery wafer is better controlled, sintering effect of glass is improved, and a concentration of silver ions inside the glass liquid is also improved. Thus, not only are open circuit voltages of the batteries increased, but also series resistances of batteries are reduced, thereby improving photoelectric conversion efficiency and output power of batteries.

In summary, the conductive silver aluminum paste of the present invention effectively controls corrosion effect and corrosion depths of glass by utilizing interaction among glass powder, silver powder, and aluminum powder, and at the same time, utilizes inherent characteristics of N-type Topcon batteries to achieve batteries and electronic components with low contact resistances, high open circuit voltages, high photoelectric conversion efficiency, and high output power.

DETAILED DESCRIPTION

The present invention provides a conductive silver aluminum paste comprising silver powder, metal powder containing aluminum element, powder containing silicon or boron element, glass powder, and organic carrier; wherein, when defining the total weight of the conductive silver aluminum paste as 100%, the weight percentage contents of the component are: silver powder 80.0%-90.0%, metal powder containing aluminum element 0.5%-3.0%; powder containing silicon or boron element 0.1%-1.0%; glass powder 1.5%-6.0%; organic carrier 7.0%-15.0%.

Furthermore, the silver powder can also account for 80%, 82%, 84%, 86%, 88%, 90%, etc. of the total weight of conductive silver aluminum paste; the metal powder containing aluminum element can also account for 0.5%, 1.0%, 1.5%, 2.0%, 2.5%, 3.0%, etc. of the total weight of conductive silver aluminum paste; the powder containing silicon or boron element can also account for 0.1%, 0.3%, 0.6%, 0.9%, 1.0%, etc. of the total weight of conductive silver aluminum paste; the glass powder can also account for 1.5%, 2.0%, 2.5%, 3.0%, 4.0%, 5.0%, 5.5%, 6.0%, etc. of the total weight of conductive silver aluminum paste; the organic carrier can also account for 7.0%, 7.6%, 8.8%, 9.0%, 12%, 13%, 15%, etc. of the total weight of conductive silver aluminum paste.

Among them, the silver powder and the metal powder containing aluminum element are spherical. The silver powder has a particle size of 0.2 μm~4.5 μm and a D50 of 0.6 μm~2.5 μm. The metal powder containing aluminum element has a particle size of 0.1 μm~6.0 μm and a D50 of 0.6

μm~2.0 μm. The metal powder containing aluminum element is one or more of aluminum powder and alloy powder containing aluminum element, and the alloy powder containing aluminum element comprises at least one of aluminum silicon alloy, aluminum boron alloy, aluminum gallium alloy, aluminum lead alloy, and aluminum iron alloy powder. The powder containing silicon or boron element has a particle size of 0.5 μm~8.0 μm and a D50 of 0.8 μm~3.0 μm. The powder containing silicon or boron element is one or more of silicon powder, boron powder, compound powder containing silicon or boron element, and alloy powder containing silicon or boron element; the compound powder containing silicon or boron element comprises at least one of silicon nitride, silicon carbide, boron nitride, tungsten boride, tungsten silicide, and silicon boride powder, and the alloy powder containing silicon or boron element comprises at least one of silicon magnesium alloy and boron lead alloy powder.

Furthermore, the glass powder comprises one or more kind of main glass powder, or comprises one or more kind of main glass powder and one or more kind of auxiliary glass powder; wherein the main glass powder is in a Pb—B—Ge—O—Li system or a Pb—B—Si—O—Li system, or is Pb—B—Ge—Si—O—Li glass powder in a composite structure of the two; the auxiliary glass powder is in a Zn—Si—B—O—Li system or in a Ba—Si—B—O—Li system, or is Zn—Ba—Si—B—O—Li glass powder in a composite structure of the two; when defining the total weight of the glass powder as 100%, the weight percentage contents of the main glass powder and the auxiliary glass powder are: main glass powder 50%-100.0%; auxiliary glass powder 0.0%-50.0%.

Specifically, in this embodiment, the glass powder can include only main glass powder, wherein the main glass powder is one or more of glass powder in a Pb—B—Ge—O—Li system, in a Pb—B—Si—O—Li system, and in a composite structure Pb—B—Ge—Si—O—Li of the two; alternatively, the glass powder can also include main glass powder and auxiliary glass powder, wherein the main glass powder is one or more of glass powder in a Pb—B—Ge—O—Li system, in a Pb—B—Si—O—Li system, and in a composite structure Pb—B—Ge—Si—O—Li of the two, and the auxiliary glass powder is one or more of glass powder in a Zn—Si—B—O—Li system or in a Ba—Si—B—O—Li system, or in a composite structure Zn—Ba—Si—B—O—Li of the two. The main glass powder has strong oxidability and a low glass softening point, and thus has good liquid phase sintering effect. After melting, the viscosity of glass liquid is low, it has good flowability and can effectively corrode surface insulating anti-reflection films of the batteries, thereby forming excellent ohmic contact. The auxiliary glass powder has weak oxidation and a high glass softening point, after melting, the viscosity of glass liquid is high, and it has the characteristic of being difficult to flow. It can be stored at high temperatures in a silver layer to aid in sintering of silver powder and aluminum powder, and at the same time, can also adjust a corrosion strength of the main glass powder at high temperatures, reduce resistance of gate line bodies, and increase open circuit voltages of batteries. In addition, auxiliary glass powder, due to its weak oxidability, can prevent oxidation of aluminum powder during a high temperature stage, which is conducive to formation of P++ junction areas by introduced aluminum powder, thereby improving minority carrier diffusion ability and increasing open circuit voltages. Whether to add the auxiliary glass powder and the level of addition amount can be selected based on characteristics of selected main glass powder, so that a utilizing window of the silver aluminum paste of the present invention can be expanded to meet needs of N-type topcon batteries with different manufacturing processes and N-type topcon batteries with silver aluminum paste grid lines sintered at different temperatures.

Furthermore, in the above conductive silver aluminum paste, in the main glass powder, when defining the total number of moles of the components contained in the main glass powder as 100%, the mole percentages of the components are: PbO 20.0%~60.0%; $B_2O_3$ 2.0%~40.0%; the sum of $GeO_2$ and $SiO_2$ 2.0%~40.0%; $Li_2O$ 2.0%~20.0%; modified additive 0.0%~35.0%.

Among them, the modified additive is an oxide containing one or more element of Ca, Sr, Ba, Zn, Na, K, Cu, Tl, Ag, Al, Bi, W, Ga, Pr, Se, and Fe, or a composite that decomposes to obtain the oxide of the element during a process of manufacturing the main glass powder; the composite can be selected as carbonate that decomposes into the oxide of the element, but is not limited to this.

Similarly, in the main glass powder, the components PbO, $B_2O_3$, $GeO_2$, $SiO_2$, $Li_2O$, etc. can be oxides added directly, and can also be composites that decompose to obtain the above components during a process of manufacturing the main glass powder.

Furthermore, in the above conductive silver aluminum paste, in the auxiliary glass powder, when defining the total number of moles of the components contained in the auxiliary glass powder as 100%, the mole percentages of the components are: the sum of ZnO and BaO 20.0%~50.0%; $SiO_2$ 0.0%~40.0%; $B_2O_3$ 5.0%~50.0%; $Li_2O$ 10.0%~30.0%; auxiliary additive 0.0%~20.0%.

Among them, the auxiliary additive is an oxide containing one or more element of Ca, Sr, Pb, Na, K, Tl, Ag, Al, Bi, and Ge, or a composite that decomposes to obtain the oxide of the element during a process of manufacturing the auxiliary glass powder; the composite can be selected as carbonate that decomposes into the oxide of the element, but is not limited to this.

Similarly, in the auxiliary glass powder, the components ZnO, BaO, $SiO_2$, $B_2O_3$, $Li_2O$, etc. can be oxides added directly, and can also be composites that decompose to obtain the above components during a process of manufacturing the auxiliary glass powder.

The above organic carrier includes organic solvent, organic resin, defoamer, leveling agent, and inorganic additive; when defining the total weight of the organic carrier as 100%, the weight percentage contents of the components are: organic solvent 30.0%~80.0%; organic resin 10.0%~40.0%; defoamer 2.0%~10.0%; leveling agent 2.0%~10.0%; inorganic additive 0.1%~5.0%.

Among them, the inorganic additive is one or more of magnesium lithium silicate, sodium magnesium silicate, and sodium magnesium lithium silicate. By introducing the inorganic additive, on one hand, volatility of solvents in the organic carrier is reduced, and state stability of silver paste is improved; on the other hand, screen crossing effect of silver paste is improved and printed line shapes are made to be much plump, which also indirectly improves contact resistance effect and open circuit voltages, and thus improves photoelectric conversion efficiency efficiency and output power of batteries. The organic solvent can be selected from one or more of terpineol, dodecanol ester, butyl carbitol, butyl carbitol acetate, and glycerin; the organic resin can be selected from one or more of isophthalic acid alkyd resin, acrylic resin, petroleum resin, and rosin resin; the defoamer can be selected from one or more of modified organic polysiloxane compounds, isopropanol, butanol, polyether defoamers, and organic fluorosilicone compounds; the leveling agent is one or more of silicone oil, polydimethylsiloxane, polyether polyester modified organosiloxane, and alkyl modified organosiloxane.

A method for preparing the above conductive silver aluminum paste comprises the following steps.

Preparing glass powder: weighing raw materials used in glass powder according to a preset ratio; mixing them; after melting them at a high temperature, cooling them down, and drying them, through a crushing process, obtaining required glass powder.

Among them, the preparation of glass powder includes preparations of main glass powder and of auxiliary glass powder. Raw materials of the main glass powder are weighed according to a preset ratio, ball-mixed for 10 min~40 min by a ball-milling and mixing method, and then screened to screen out evenly mixed raw materials. Then, it is melted at a high temperature of 750° C.-1250° C. for 20 min-60 min; after melting uniformly, glass liquid is rapidly cooled and then dried, and finally crushed to obtain required main glass powder. Raw materials of the auxiliary glass powder are weighed according to a preset ratio, ball-mixed for 10 min~40 min by a ball-milling and mixing method, and then screened to screen out evenly mixed raw materials. Then, it is melted at a high temperature of 750° C.-1250° C. for 20 min~60 min; after melting uniformly, glass liquid is rapidly cooled and then dried, and finally crushed to obtain required auxiliary glass powder.

Preparing organic carrier: weighing raw materials used in organic carrier according to a preset ratio; heating, stirring, and mixing them; dispersing them uniformly through high-speed centrifugation, and then filtering them to obtain organic carrier.

Preparing conductive silver aluminum paste: adding silver powder, metal powder containing aluminum element, powder containing silicon or boron element, and prepared glass powder into prepared organic carrier respectively according to a mass ratio, mixing them and stirring them uniformly, and then grinding them by three rolls, adjusting their viscosity, and filtering them to obtain conductive silver aluminum paste.

The present invention further provides an electrode, the electrode is formed by sintering the above conductive silver aluminum paste on a surface of a battery silicon wafer. Specifically, the conductive silver aluminum paste is screen printed, dried, and sintered into metal grid lines on the surface of the battery silicon wafer to form the required electrode. For other technical features of this electrode, please refer to the existing technology and will not be elaborated here.

The present invention further provides an N-type Topcon battery comprising the above electrode. For other technical features of this N-type Topcon battery, please refer to the existing technology and will not be elaborated here.

The following further describes the present invention in detail in combination with experimental examples and specific implementations. However, it should not be considered that the scope of the above subject matter of the present invention is limited to the following embodiments, and any technology implemented based on the content of the present invention belongs to the scope of the present invention.

The following will be explained in conjunction with specific embodiments.

Embodiments Z01-Z06

Preparation of main glass powder: raw materials used in main glass powder are respectively calculated and weighed according to a preset formula, and then the raw materials are mixed evenly by ball milling and added into a crucible; the crucible is placed in a muffle furnace, and the raw materials are melted at a high temperature of 750° C.-1250° C. for 20 min~60 min. After melting evenly, glass liquid is quenched by water or poured into a low-temperature tank to be cooled rapidly, thereby obtaining coarse glass powder. Then the coarse glass powder is dried quickly; after drying, dried coarse glass powder particles are added into a disc mill and crushed into primary glass powder under a disc gap of 50-200 microns. Finally, under a pressure of 6-12 MPa in an air flow crusher, the primary glass powder is crushed into the required main glass powder Z01-Z06 with particle sizes of 0.2~8.0 microns ready for use. Specific mole composition ratios of the components of the main glass powder are shown in Table 1.

TABLE 1

| Table of Mole Components of Main Glass Powder (at %) | | | | | | |
|---|---|---|---|---|---|---|
| Number | Z01 | Z02 | Z03 | Z04 | Z05 | Z06 |
| PbO | 40.4 | 36.5 | 20.0 | 60.0 | 30.0 | 44.1 |
| $B_2O_3$ | 10.0 | 40.0 | 10.2 | 21.0 | 10.0 | 18.2 |
| $GeO_2$ | 40.0 | | | 2.0 | 1.0 | |
| $SiO_2$ | | 2.0 | 39.6 | 12.9 | 12.0 | 9.0 |
| $Li_2CO_3$ | 9.6 | 19.5 | 20.0 | 2.0 | 12.0 | 10.2 |
| $Na_2CO_3$ | | | | | 2.4 | |
| $K_2CO_3$ | | 1.5 | 0.9 | | | |
| $CaCO_3$ | | | | 0.6 | | |
| $SrCO_3$ | | | 1.2 | | | |
| $BaCO_3$ | | | 6.0 | | 4.5 | |
| ZnO | | | | | 17.5 | 18.5 |
| CuO | | 0.5 | | | | |
| $Tl_2O_3$ | | | 1.2 | | 3.6 | |
| $Ag_2O$ | | | | 1.2 | | |
| $Al_2O_3$ | | | | | 1.4 | |
| $Bi_2O_3$ | | | | | 2.0 | |
| $WO_3$ | | | 0.9 | | | |
| $Ga_2O_3$ | | | | | 0.6 | |
| $Fe_2O_3$ | | | | | 3.0 | |
| $Pr_2O_3$ | | | | 0.3 | | |
| Total | 100.0 | 100.0 | 100.0 | 100.0 | 100.0 | 100.0 |

Embodiments F01-F06

Preparation of auxiliary glass powder: raw materials used in auxiliary glass powder are respectively calculated and weighed according to a preset formula, and then the raw materials are mixed evenly by ball milling and added into a crucible; the crucible is placed in a muffle furnace, and the raw materials are melted at a high temperature of 750° C.-1250° C. for 20 min~60 min. After melting evenly, glass liquid is quenched by water or poured into a low-temperature tank to be cooled rapidly, thereby obtaining coarse glass powder. Then the coarse glass powder is dried quickly; after drying, dried coarse glass powder particles are added into a disc mill and crushed into primary glass powder under a disc gap of 50-200 microns. Finally, under a pressure of 6-12 MPa in an air flow crusher, the primary glass powder is crushed into the required auxiliary glass powder F01-F06 with particle sizes of 0.2~8.0 microns ready for use. Specific mole composition ratios of the components of the auxiliary glass powder are shown in Table 2.

TABLE 2

| Table of Mole Components of Auxiliary Glass Powder (at %) | | | | | | |
|---|---|---|---|---|---|---|
| Number | F01 | F02 | F03 | F04 | F05 | F06 |
| ZnO | 28.6 | | 31.7 | 50.0 | 38.0 | 19.2 |
| $BaCO_3$ | | 20.1 | 2.1 | | | 30.5 |
| $SiO_2$ | | 40.0 | 20.4 | 0.5 | 22.9 | |
| $B_2O_3$ | 50.0 | 5.0 | 21.0 | 30.0 | 9.1 | 30.0 |
| $Li_2CO_3$ | 21.4 | 30.0 | 21.0 | 15.0 | 10.0 | 15.0 |
| $Na_2CO_3$ | | 1.2 | | 0.6 | 2.7 | 1.8 |
| $K_2CO_3$ | | | | 2.4 | | |
| PbO | | 2.4 | 1.7 | | 17.3 | |
| $GeO_2$ | | | 1.0 | | | |
| $CaCO_3$ | | 0.5 | | | | 3.0 |
| $SrCO_3$ | | 0.8 | | | | |
| $Tl_2O_3$ | | | 0.6 | | | 0.5 |
| $Ag_2O$ | | | | 0.3 | | |
| $Al_2O_3$ | | | 0.5 | | | |
| $Bi_2O_3$ | | | | 1.2 | | |
| Total | 100.0 | 100.0 | 100.0 | 100.0 | 100.0 | 100.0 |

Embodiments C01-C06

Preparation of organic carrier: prepared raw materials of organic carrier, including organic solvent, organic resin, defoamer, leveling agent, and inorganic additive, are weighed according to a preset ratio. Afterwards, they are heated in a water bath at 60-100° C., stirred, and mixed evenly. Then they are dispersed uniformly by centrifugation in a condition of 1000-3000 rpm and are filtered. Finally, they are stirred and mixed evenly at a room temperature to obtain organic carriers C01-C06 ready for use. Specific weight composition ratios of the components of the organic carrier are shown in Table 3.

TABLE 3

| Table of Weight Components of Organic carrier (wt %) | | | | | | |
|---|---|---|---|---|---|---|
| Number | C01 | C02 | C03 | C04 | C05 | C06 |
| Organic solvent | 63.0 | 47.9 | 80.0 | 40.0 | 54.8 | 70.6 |
| Organic resin | 20.0 | 40.0 | 10.0 | 40.0 | 35.2 | 17.2 |
| Defoamer | 10.0 | 2.0 | 2.5 | 8.0 | 2.4 | 4.2 |
| Leveling agent | 2.0 | 10.0 | 4.0 | 10.0 | 6.0 | 5.8 |
| Inorganic additive (name/ content) | Lithium magnesium silicate/3.4 Lithium magnesium sodium silicate/1.6 | Lithium magnesium silicate/0.1 | Lithium magnesium silicate/3.5 | Sodium magnesium silicate/2.0 | Lithium magnesium sodium silicate/1.6 | Lithium magnesium silicate/1.7 Sodium magnesium silicate/0.5 |
| Total | 100.0 | 100.0 | 100.0 | 100.0 | 100.0 | 100.0 |

Embodiments TN01-TN12

Preparation of conductive silver aluminum paste: for the convenience of recording and selecting, silver powder with a required particle size is numbered S1. Required metal powder containing aluminum element is numbered A1-A6, and specific substances specifically corresponding to A1-A6 are shown in Table 4. Required powder containing silicon or boron element is numbered B1-B10, and specific substances corresponding to B1-B10 are shown in Table 5.

TABLE 4

Numbering table of metal powder containing aluminum element

| Substance name | Substance number |
|---|---|
| Aluminum powder | A1 |
| Aluminum silicon alloy powder | A2 |
| Aluminum boron alloy powder | A3 |
| Aluminum gallium alloy powder | A4 |
| Aluminum lead alloy powder | A5 |
| Aluminum iron alloy powder | A6 |

TABLE 5

Numbering table for powder containing silicon or boron element

| Substance name | Substance number |
|---|---|
| Boron powder | B1 |
| Silicon powder | B2 |
| Silicon nitride powder | B3 |
| Silicon carbide powder | B4 |
| Boron nitride powder | B5 |
| Tungsten boride powder | B6 |
| Tungsten silicide powder | B7 |
| Silicon boride powder | B8 |
| Silicon magnesium alloy powder | B9 |
| Boron lead alloy powder | B10 |

At first, according to a preset ratio, the organic carrier with a corresponding weight percentage mass is weighed, and then the prepared silver powder, metal powder containing aluminum element, powder containing silicon or boron element, and glass powder with corresponding weight percentage masses are weighed respectively. The components are added into the weighed organic carrier, stirred and mixed evenly with a mixer, then ground evenly by a three roller mill, and subjected to suction filtration to obtain the required conductive silver aluminum paste TN01-TN12. Specific weight percentage composition of the conductive silver aluminum paste is shown in Table 6.

TABLE 6

Table of weight composition of conductive silver aluminum paste (w t%)

| Paste number | Item | Silver powder | Metal powder containing aluminum element | Powder containing silicon or boron element | Main glass powder | Auxiliary glass powder | Organic carrier |
|---|---|---|---|---|---|---|---|
| TN01 | Number | S1 | A1 | B1 + B2 | Z01 | None | C01 |
| | Content | 83.1 | 1.5 | 0.2 + 0.2 | 6.0 | 0.0 | 9.0 |
| TN02 | Number | S1 | A1 + A2 | B1 | Z01 + Z06 | F01 | C01 |
| | Content | 85.9 | 0.4 + 0.6 | 0.1 | 2.0 + 3.0 | 1.0 | 7.0 |
| TN03 | Number | S1 | A1 + A2 | B7 | Z03 + Z04 | F03 | C02 |
| | Content | 80.0 | 2.1 + 0.7 | 1.0 | 2.2 + 2.3 | 2.0 | 9.7 |
| TN04 | Number | S1 | A3 + A6 | B8 | Z02 | F02 + F05 | C05 |
| | Content | 81.0 | 0.1 + 0.4 | 0.3 | 2.6 | 0.3 + 0.3 | 15.0 |
| TN05 | Number | S1 | A2 + A5 | B1 + B7 | Z06 | F01 + F02 + F03 | C04 |
| | Content | 90.0 | 0.2 + 0.3 | 0.1 + 0.1 | 1.5 | 0.2 + 0.1 + 0.3 | 7.2 |
| TN06 | Number | S1 | A1 + A5 | B1 + B2 + B10 | Z04 + Z05 + Z06 | F04 | C02 |
| | Content | 81.8 | 1.0 + 0.8 | 0.2 + 0.2 + 0.1 | 1.0 + 1.0 + 1.0 | 0.9 | 12.0 |
| TN07 | Number | S1 | A1 + A3 + A5 | B2 + B5 | Z01 + Z02 | F02 + F06 | C03 |
| | Content | 84.0 | 0.2 + 0.5 + 0.5 | 0.1 + 0.3 | 2.0 + 0.5 | 0.2 + 0.3 | 11.4 |
| TN08 | Number | S1 | A3 | B4 + B6 | Z04 + Z05 | F05 | C06 |
| | Content | 84.0 | 1.3 | 0.05 + 0.05 | 1.0 + 0.3 | 0.2 | 13.1 |
| TN09 | Number | S1 | A1 | B2 | Z04 | None | C06 |
| | Content | 87.2 | 3.0 | 0.3 | 1.5 | 0.0 | 8.0 |
| TN10 | Number | S1 | A2 + A4 | B1 + B3 | Z01 + Z03 + Z06 | F02 | C05 |
| | Content | 80.0 | 2.0 | 0.2 + 0.5 | 4.2 | 0.3 | 12.8 |
| TN11 | Number | S1 | A1 + A4 | B2 + B9 | Z2 + Z4 | F01 | C04 |
| | Content | 85.2 | 0.5 + 0.2 | 0.1 + 0.4 | 2.0 + 0.3 | 2.2 | 9.1 |
| TN12 | Number | S1 | A6 | B1 + B2 | Z06 | F03 + F05 | C03 |
| | Content | 86.7 | 1.5 | 0.15 + 0.15 | 3.0 | 0.1 + 0.1 | 8.3 |

The silver aluminum paste TN01-TN12 prepared in the above embodiment is respectively printed on N-type topcon batteries with different square resistances under the same printing conditions, and then sintered in multiple temperature zones. Finally, electrical properties of sintered N-type topcon battery cells with different square resistances at the same temperature and of N-type topcon battery cells sintered at different temperatures are tested. In order to visually compare effectiveness of the present invention, the product 995PFB of Shanghai Silver Paste Science and Technology Co., Ltd., which is widely used in the market, is selected. After printing and sintering under the same conditions, its tested electrical performances are compared with that of the conductive silver aluminum paste of the present invention. Specific electrical performances of the embodiments TN01-TN12 and the comparative example 995PFB are shown in the following Table 7.

TABLE 7

Table of test data of electrical performances of silver aluminum pastes

| | Paste number | N-type topcon battery type | Peak sintering temperature (° C.) | Open circuit voltage (V) | Series resistance (mΩ) | Photo-electric conversion efficiency |
|---|---|---|---|---|---|---|
| Comparative Example | 995PFB | Non-SE type | 760 | 0.7151 | 0.642 | 24.67% |
| Embodiment | TN01 | Non-SE type | 760 | 0.7175 | 0.524 | 24.93% |
| | TN02 | Non-SE type | 760 | 0.7173 | 0.554 | 24.86% |
| | TN03 | Non-SE type | 760 | 0.7182 | 0.557 | 24.90% |
| | TN04 | Non-SE type | 760 | 0.7193 | 0.516 | 24.97% |
| | TN05 | Non-SE type | 760 | 0.7188 | 0.531 | 24.91% |
| | TN06 | Non-SE type | 760 | 0.7191 | 0.547 | 24.89% |
| | TN07 | Non-SE type | 760 | 0.7179 | 0.509 | 24.95% |
| | TN08 | Non-SE type | 760 | 0.7184 | 0.525 | 24.99% |
| | TN09 | Non-SE type | 760 | 0.7195 | 0.578 | 24.87% |
| | TN10 | Non-SE type | 760 | 0.7191 | 0.523 | 24.98% |
| | TN11 | Non-SE type | 760 | 0.7177 | 0.517 | 24.88% |
| | TN12 | Non-SE type | 760 | 0.7196 | 0.501 | 25.04% |
| Comparative Example | 995PFB | SE type | 760 | 0.7162 | 0.547 | 24.83% |
| Embodiment | TN01 | SE type | 760 | 0.7180 | 0.482 | 25.03% |
| | TN02 | SE type | 760 | 0.7192 | 0.501 | 25.06% |
| | TN03 | SE type | 760 | 0.7193 | 0.507 | 25.06% |
| | TN04 | SE type | 760 | 0.7199 | 0.456 | 25.19% |
| | TN05 | SE type | 760 | 0.7195 | 0.465 | 25.13% |
| | TN06 | SE type | 760 | 0.7198 | 0.473 | 25.18% |
| | TN07 | SE type | 760 | 0.7184 | 0.451 | 25.10% |
| | TN08 | SE type | 760 | 0.7192 | 0.466 | 25.11% |
| | TN09 | SE type | 760 | 0.7205 | 0.512 | 25.09% |
| | TN10 | SE type | 760 | 0.7197 | 0.483 | 25.13% |
| | TN11 | SE type | 760 | 0.7182 | 0.492 | 25.03% |
| | TN12 | SE type | 760 | 0.7195 | 0.451 | 25.23% |
| Comparative Example | 995PFB | Non-SE type | 780 | 0.7132 | 0.571 | 24.32% |
| Embodiment | TN01 | Non-SE type | 780 | 0.7171 | 0.484 | 24.89% |
| | TN02 | Non-SE type | 780 | 0.7171 | 0.514 | 24.88% |
| | TN03 | Non-SE type | 780 | 0.7173 | 0.527 | 24.87% |
| | TN04 | Non-SE type | 780 | 0.7191 | 0.468 | 25.02% |
| | TN05 | Non-SE type | 780 | 0.7182 | 0.461 | 24.97% |
| | TN06 | Non-SE type | 780 | 0.7179 | 0.495 | 24.94% |
| Comparative Example | 995PFB | Non-SE type | 740 | 0.7175 | 0.945 | 23.57% |
| Embodiment | TN01 | Non-SE type | 740 | 0.7183 | 0.609 | 24.82% |
| | TN02 | Non-SE type | 740 | 0.7193 | 0.611 | 24.84% |
| | TN03 | Non-SE type | 740 | 0.7186 | 0.607 | 24.87% |
| | TN04 | Non-SE type | 740 | 0.7199 | 0.563 | 24.95% |
| | TN05 | Non-SE type | 740 | 0.7194 | 0.577 | 24.89% |
| | TN06 | Non-SE type | 740 | 0.7197 | 0.569 | 24.91% |
| Comparative Example | 995PFB | SE type | 780 | 0.7137 | 0.501 | 24.56% |
| 实施例 | TN07 | SE type | 780 | 0.7179 | 0.441 | 25.08% |
| | TN08 | SE type | 780 | 0.7188 | 0.422 | 25.10% |
| | TN09 | SE type | 780 | 0.7199 | 0.428 | 25.17% |
| | TN10 | SE type | 780 | 0.7176 | 0.471 | 25.01% |
| | TN11 | SE type | 780 | 0.7179 | 0.483 | 25.02% |
| | TN12 | SE type | 780 | 0.7189 | 0.415 | 25.15% |
| Comparative Example | 995PFB | SE type | 740 | 0.7178 | 0.764 | 24.69% |
| Embodiment | TN07 | SE type | 740 | 0.7188 | 0.484 | 25.01% |
| | TN08 | SE type | 740 | 0.7198 | 0.525 | 25.09% |
| | TN09 | SE type | 740 | 0.7213 | 0.628 | 25.12% |
| | TN10 | SE type | 740 | 0.7201 | 0.612 | 25.07% |
| | TN11 | SE type | 740 | 0.7195 | 0.533 | 25.01% |
| | TN12 | SE type | 740 | 0.7196 | 0.484 | 25.15% |

It can be known from the Table 7 that: by comparing the embodiments TN01-TN12 of the present invention with the product 995PFB used in large quantities in the market, it is found that whether in non-SE or SE N-type Topcon batteries, regarding the batteries with silver aluminum paste printing electrode provided by the present invention, open circuit voltages have significant increasement, series resistances is also low, and the conversion efficiency has greater advantage, which indicates that the silver aluminum paste provided by the present invention has good contact effect, high open circuit voltages, and high photoelectric conversion efficiency. At the same time, by comparing the embodiments TN01-TN12 sintered at different temperatures and the product 995PFB used in large quantities in the market, it is found that whether it is a non SE or SE N-type Topcon battery, when the sintering temperature rises, a drop amplitude of an open voltage of 995PFB is greater than that of the silver aluminum paste; and when the sintering temperature drops, a rising amplitude of the series resistance of 995-PFB is also greater than that of the silver aluminum paste, the photoelectric conversion efficiency efficiency drops significantly. However, in the embodiments TN01-TN12 of the present invention, no matter whether the sintering temperature increases or decreases, change amplitudes of open voltages are small, change amplitude of series resistances are small, and change of photoelectric conversion efficiency of the batteries is also small. Among them, advantages of TN12 are more prominent, it is indicated that the silver aluminum paste of the present invention can well meet different sintering processes, has a wide application window, and can also well meet N-type topcon batteries with different processes, which all have low contact resistances, high open circuit voltages, excellent photoelectric conversion efficiency; batteries or electronic devices composed by them also have high output power.

The above description is only a specific implementation of the present invention, but the protection scope of the present invention is not limited to this. Any changes or replacements that can easily be imagined by technicians familiar with the technical field within the technical scope disclosed by the present invention should be covered within the protection scope of the present invention. Therefore, the protection scope of the present invention should be based on the attached claims.

What is claimed is:

1. A method for preparing a conductive silver aluminum paste, comprising the following steps:

preparing glass powder: weighing raw materials used in glass powder according to a preset ratio;

mixing them; after melting them at a high temperature, cooling them down, and drying them, through a crushing process, obtaining required glass powder;

preparing organic carrier: weighing raw materials used in organic carrier according to a preset ratio; heating, stirring, and mixing them; dispersing them uniformly through high-speed centrifugation, and then filtering them to obtain organic carrier;

preparing conductive silver aluminum paste: adding silver powder, metal powder containing aluminum element, powder containing silicon or boron element, and prepared glass powder into prepared organic carrier respectively according to a mass ratio, mixing them and stirring them uniformly, and then grinding them, adjusting their viscosity, and filtering them to obtain conductive silver aluminum paste; wherein, when defining the total weight of the conductive silver aluminum paste as 100%, the weight percentage contents of the components are: silver powder 80.0%-90.0%, metal powder containing aluminum element 0.5%-3.0%; powder containing silicon or boron element 0.1%-1.0%; glass powder 1.5%-6.0%; organic carrier 7.0%-15.0%.

* * * * *